(12) United States Patent
Bains

(10) Patent No.: US 9,009,362 B2
(45) Date of Patent: Apr. 14, 2015

(54) VARIABLE-WIDTH COMMAND/ADDRESS BUS

(71) Applicant: Kuljit S. Bains, Olympia, WA (US)

(72) Inventor: Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 13/722,666

(22) Filed: Dec. 20, 2012

(65) Prior Publication Data

US 2014/0181333 A1 Jun. 26, 2014

(51) Int. Cl.
*G06F 3/00* (2006.01)
*G11C 7/10* (2006.01)
*G06F 13/16* (2006.01)

(52) U.S. Cl.
CPC .............. *G11C 7/10* (2013.01); *G06F 13/1668* (2013.01)

(58) Field of Classification Search
CPC ............................... G06F 3/0653; G06F 13/40
USPC .......................................................... 710/16
See application file for complete search history.

(56) References Cited

U.S. PATENT DOCUMENTS

| 2009/0327792 | A1 | 12/2009 | Salmon et al. | |
| 2010/0103713 | A1* | 4/2010 | Kizer et al. | 365/51 |
| 2011/0135030 | A1 | 6/2011 | Bae | |
| 2011/0138133 | A1 | 6/2011 | Shaeffer | |
| 2011/0261636 | A1* | 10/2011 | Bains et al. | 365/193 |

FOREIGN PATENT DOCUMENTS

KR 10-2012-0109958 10/2012

OTHER PUBLICATIONS

International Search Report and Written Opinion from PCT/US2013/045499 mailed Sep. 26, 2013, 11 pages.

* cited by examiner

*Primary Examiner* — Chun-Kuan Lee
(74) *Attorney, Agent, or Firm* — Blakely, Sokoloff, Taylor & Zafman LLP

(57) ABSTRACT

Embodiments of the invention relate to a variable-width command/address bus (CA bus). In one embodiment, a memory controller includes first logic to determine whether a memory device is in a first mode or a second mode. The memory controller includes second logic to transmit a command to the memory device with a command/address bus having a first width over a first number of clock edges when the memory device is in the first mode, and with the command/address bus having a second width over a second number of clock edges when the memory device is in the second mode.

20 Claims, 9 Drawing Sheets

FIG. 2

| SDRAM Command | Command Pins | | | CA pins (10) | | | | | | | | | | |
|---|---|---|---|---|---|---|---|---|---|---|---|---|---|---|
| | CKE | | CS_N | CA0 | CA1 | CA2 | CA3 | CA4 | CA5 | CA6 | CA7 | CA8 | CA9 | |
| | CK_t(n-1) | CK_t(n) | | | | | | | | | | | | |
| MRW | H | H | L | L | L | L | L | MA0 | MA1 | MA2 | MA3 | MA4 | MA5 | |
| | | | X | MA5 | MA7 | OP0 | OP1 | OP2 | OP3 | OP4 | OP5 | OP6 | OP7 | |
| MRR | H | H | L | L | L | L | H | MA0 | MA1 | MA2 | MA3 | MA4 | MA5 | |
| | | | X | MA6 | MA7 | X | | | | | | | | |
| Refresh (per bank) | H | H | L | L | L | H | L | X | | | | | | |
| | | | X | X | | | | | | | | | | |
| Refresh (all bank) | H | H | L | L | L | H | H | X | | | | | | |
| | | | X | X | | | | | | | | | | |
| Enter Self Refresh | H | L | L | L | L | H | X | | | | | | | |
| | X | | X | X | | | | | | | | | | |
| Activate (bank) | H | H | L | L | H | R8 | R9 | R10 | R11 | R12 | BA0 | BA1 | BA2 | |
| | | | X | R0 | R1 | R2 | R3 | R4 | R5 | R6 | R7 | R13 | R14 | |
| Write (bank) | H | H | L | H | L | L | RFU | RFU | C1 | C2 | BA0 | BA1 | BA2 | |
| | | | X | AP3 | C3 | C4 | C5 | C6 | C7 | C8 | C9 | C10 | C11 | |
| Read (bank) | H | H | L | H | L | H | RFU | RFU | C1 | C2 | BA0 | BA1 | BA2 | |
| | | | X | AP3 | C3 | C4 | C5 | C6 | C7 | C8 | C9 | C10 | C11 | |
| Precharge (pre bank, all bank) | H | H | L | H | H | L | H | AB | X | X | BA0 | BA1 | BA2 | |
| | | | X | X | X | X | X | X | X | X | X | X | X | |
| Enter Deep Power Down | H | L | L | H | H | L | X | | | | | | | |
| | X | | X | X | | | | | | | | | | |
| NOP | H | H | L | H | H | H | X | | | | | | | |
| | | | X | X | | | | | | | | | | |
| Maintain PD, SREF, DPD (NOP) | L | L | L | H | H | H | X | | | | | | | |
| | | | X | X | | | | | | | | | | |
| NOP | H | H | H | X | | | | | | | | | | |
| | | | X | X | | | | | | | | | | |
| Maintain PD, SREF, DPD (NOP) | L | L | H | X | | | | | | | | | | |
| | | | X | X | | | | | | | | | | |
| Enter Power Down | H | L | H | X | | | | | | | | | | |
| | X | | X | X | | | | | | | | | | |
| Exit PD, SREF, DPD | L | H | H | X | | | | | | | | | | |
| | X | | X | X | | | | | | | | | | |

VARIABLE-WIDTH COMMAND/ADDRESS BUS

FIELD

Embodiments of the invention are generally related to memory, and more particularly to memory command/address buses.

BACKGROUND

A variety of integrated circuit packaging techniques exist which have different benefits for different applications. For example, a ball grid array (BGA) package is one type of packaging for integrated circuits. In a BGA package, a surface of the package provides pins to interconnect with other circuits (e.g., via a grid of solder balls). The BGA package is not mounted on top of other packages, and generally sits on a circuit board (e.g., a motherboard). Another example of packaging for integrated circuits is a package on package (PoP) configuration. In PoP configurations, two or more packages are positioned on top of one another. PoP configurations can be useful for compact computing applications (e.g., smartphones, tablets, netbooks, cameras, and other compact electronic devices) due to the ability to vertically stack integrated circuit packages, and achieve a high density of integrated circuits. PoP configurations can use solder balls like BGA packages, but due to the stacked nature, PoP configurations generally have pins on the periphery of the package instead of spread over an entire surface of the package, and therefore have less area for pins. Other packaging types also exist which allow for varying numbers of pins and circuit density.

Memory devices can be packaged via different methods, but packaging configurations for a given memory device are limited by, for example, the number of available pins. A given memory device generally requires a particular number of pins for uses such as the command/address bus, the data bus, and/or other pins such as control pins. For example, if a given memory device requires a certain number of pins, and a PoP configuration will make available fewer pins than necessary for that memory device, then a PoP configuration may not be used for that memory device. Therefore, with current technology, a given memory device may have limited packaging options, and therefore be used in limited computing applications.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive. In the following description and claims, the term "coupled" and its derivatives may be used. The term "coupled" herein may refer to two or more elements which are in direct contact (physically, electrically, magnetically, optically, etc.), or to two or more elements that are not in direct contact with each other, but which still interact with each other.

FIG. 2 is a command truth table for a memory device with a variable-width CA bus when the memory device is in a 10-bit CA pin mode, according to one embodiment.

Descriptions of certain details and implementations follow, including a description of the figures, which may depict some or all of the embodiments described below, as well as discussing other potential embodiments or implementations of the inventive concepts presented herein.

DETAILED DESCRIPTION

Embodiments of the invention relate to systems, apparatuses, and methods with variable-width command/address (CA) buses for memory devices. In one such embodiment a memory controller determines which mode the memory device is in. For example, the memory device can be in one mode for BGA packaging and a second mode for PoP packaging. The first mode can correspond to a wider CA bus, and the second mode can correspond to a narrower CA bus. After determining which mode the memory device is in, the memory controller can transmit commands to the memory device over a predetermined number of clock edges depending on the mode. For example, the memory controller may send an Activate command to the memory device over one number of clock edges in the first mode, and over a greater or lesser number of clock edges in the second mode.

A "clock edge" can include a rising or falling clock edge. Some embodiments may send data and/or commands over both rising and falling clock edges (e.g., double data rate) and some embodiments may send data and/or commands over only rising or falling clock edges (e.g., single data rate). Some embodiments may operate at a single-data rate for one bus, and a double-data rate for another bus. Whether to operate at a single-data rate or a double-data rate can depend on, for example, the clock frequency and/or the width of the bus. For example, the higher margin that can be achieved when using only rising or falling edges can be beneficial for high frequency applications. In another example, a wide bus (e.g., a wide CA bus) can make the speed gains of double-data rate less important due to the speed gains achieved as a result of the wide bus.

A variable-width CA bus can enable the same memory die to be used in a variety of packaging configurations having different numbers of available pins without limiting the memory die to the lowest common denominator. For example, the same DRAM die with a variable-width CA bus can be incorporated into a discreet BGA package or into a PoP configuration having fewer available pins than the discreet BGA package. In this example, the DRAM die may operate at a faster speed in the BGA package than in the PoP package due to the greater number of available pins.

Figure 1:
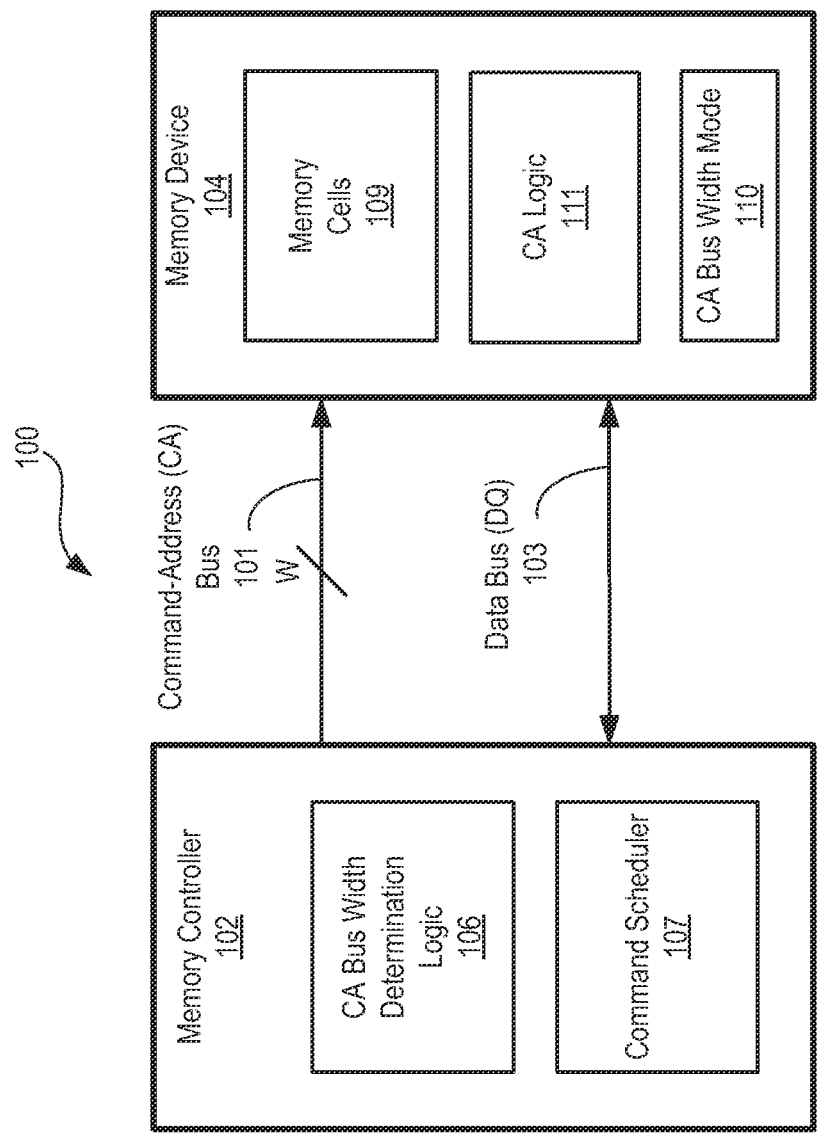
FIG. 1 is a block diagram of a memory subsystem with a variable-width command/address (CA) bus, according to one embodiment.

FIG. 1 is a block diagram of a memory subsystem with a variable-width command/address (CA) bus, according to one embodiment.

The memory subsystem 100 includes a memory controller 102 and one or more memory devices 104. Although a single memory device is illustrated, memory subsystem 100 can include any number of memory devices (e.g., 2, 4, or any other number of memory devices). The memory device 104 includes memory cells 109 (e.g., one or more memory cell arrays). The memory device 104 can include any type of memory technology. Examples provided herein primarily discuss variable-width CA buses with respect to DRAM. However, it will be understood that a variable-width CA bus can apply to other memory technologies that utilize a memory controller or equivalent logic. In one embodiment, the variable-width CA bus described herein can be used for a number of memory technologies, such as dual data rate version 3 (DDR3), dual data rate version 4 (DDR4), low power DDR4 (LPDDR4), or Wide I/O. The memory device 104 can be packaged in a variety of ways, including, for example, packages which are mounted directly on a motherboard such as PoP or BGA packages, or memory modules such as small outline dual in-line memory modules (SO-DIMMs), unbuffered dual in-line memory modules (UDIMMs), or registered dual in-line memory modules (RDIMMs).

A Command/Address bus (CA bus) 101 and a data bus (DQ bus) 103 couple the memory controller 102 with the memory device 104. The memory controller 102 transmits commands and address information to the memory device 104 via the CA bus 101, and the memory controller 102 and the memory device 104 transfer data to and from one another via the data bus 103.

The CA bus 101 has a variable width, W. The width of the CA bus is the number of available pins for transmission of command and address data. According to one embodiment, the width W is dynamically configurable (e.g., the width of the CA bus is configurable upon startup of a system including memory subsystem 100 and/or during operation of the system). In one embodiment, the width of the variable-width CA bus 101 depends upon a mode of the memory device 104. In one such embodiment, modes of the memory device can include two or more modes utilizing different numbers of CA pins. For example, a memory device can operate in different modes such as a first mode which corresponds to a variable-width CA bus 101 of a first width, or a second mode which corresponds to a variable-width CA bus 101 of a second width which is less than the first width (i.e., the first width is greater than the second width). In this example, the memory controller 102 transmits a particular command (e.g., a row selection command) over a first number of clock edges in the first mode and a second number of clock edges in the second mode, which is greater than the first number of clock edges.

In another example, a PoP mode may utilize one number of pins (e.g., 6, 8, or another number of pins), and a BGA mode may utilize a larger number of pins (e.g., 8, 10, 11, 12, or another number of pins). According to one embodiment, the width of the variable-width CA bus affects the scheduling of command and/or address information transmission. For example, if the variable-CA bus has a large width, a command or address can be transmitted over a relatively small number of clock edges (e.g., 1, 2, 3, or another small number of clock edges). If the variable-CA bus has a smaller width, a command or address can be transmitted over a larger number of clock edges (e.g., 2, 3, 4, 5, or another larger number of clock edges). Utilizing a wider CA bus can enable improved performance because commands can be sent over fewer clock edges. Therefore, a variable-width CA bus can be operated at the largest width provided for by a given type of packaging to enable operating a memory device as fast as possible given the memory technology and packaging.

In yet another example, a particular command can be transmitted over the same number of clock edges for more than one mode and/or CA bus width. For example, even if a first and a second mode of a memory device correspond to different CA bus widths, some commands such as mode register read or refresh may be transmitted over the same number of clock edges in both modes.

Thus, the memory controller 102 includes logic to determine which mode the memory device 104 is in prior to transmitting a command to the memory device 104. In the illustrated embodiment, the memory controller 102 includes CA bus width determination logic 106 which can determine the memory device mode upon, for example, startup of the system. In one embodiment, the memory device 104 powers up with a narrow CA bus 101, even if a wider CA bus is available. For example, the memory device 104 powers up with the CA bus 101 having a width which is the narrowest expected CA bus width. After powering up with the narrow CA bus 101, the CA bus width determination logic 106 can determine a number of pins available for the CA bus 101. In one embodiment, the memory controller 102 and/or the memory device 104 includes one or more control bit to enable the first mode or the second mode based on the value of the bit(s). In the illustrated embodiment, the one or more control bits of the memory device 104 are illustrated as the CA bus width mode 110. The CA bus width mode 110 can include one or more mode registers, one or more pads, or other mechanisms for conveying mode information. In an embodiment including one or more mode pads, the memory device 104 can internally strap the pad(s) to identify the mode. For example, the memory device 104 and/or the memory controller 102 can identify different modes based on the pad(s) being tied to ground or VCC.

Therefore, in some embodiments, determining the available CA bus width(s) can include, for example, reading a mode register and/or detecting what value a pad is tied to. In one embodiment, the memory controller 102 can also include registers or other mechanisms for storing the memory device mode (not shown). If the memory controller 102 includes a mechanism for storing the memory device mode, the CA bus width determination logic 106 may determine the value of the CA bus width mode 110 on the memory device 104 at an initial time only (e.g., upon power up), and can rely on the local mechanism on the memory controller 102 for subsequent determinations of the memory device mode.

If a greater number of pins are available for the CA bus than are initially being used at startup, the memory device 104 and/or the memory controller 102 can dynamically adjust the CA bus width to use the greater number of pins. For example, the memory controller 102 can modify mode registers on the memory controller and/or the memory device (e.g., CA bus width mode 110).

According to one embodiment, after determining the mode of the memory device 104, the memory controller 102 transmits a command to the memory device 104 according to the determined mode. For example, the memory controller 102 includes logic to transmit a command to the memory device 104 with the command/address bus 101 having a first width over a first number of clock edges when the memory device is in the first mode, and with the command/address bus 101 having a second width over a second number of clock edges when the memory device is in the second mode.

As illustrated, the memory controller 102 can include a command scheduler 107 which schedules command information to be transmitted to the memory device 104 based on the mode of the memory device 104. For example, the command scheduler 107 can schedule an Activate command to be sent over two, three, or four clock edges depending on the memory device mode. In some embodiments, the scheduler can be optimized to change the order of commands according to the memory device mode, and thus according to the CA bus width in that mode. A framing unit can then place the bits in the command to support narrower or wider CA buses after the memory scheduler has determined which command to issue next. An example of optimizing the order of commands can involve memory Read and Write commands. For example, Write and Read commands can take different numbers of clock cycles for different CA bus widths (e.g., 4 clocks for a narrow CA bus, and 2 clocks for wider CA bus). In this example, if an outstanding command of 4 clocks already issued, and after the first 3 clocks a Read command and a Write command are pending, then the memory controller can give higher priority to the Read command for narrower CA buses. For wider CA buses, the Write command may have already been issued because the memory controller determined which command to schedule after 2 clocks.

The memory device 104 can include logic to receive the command with the command/address bus 101 having the first width over a first number of clock edges when the memory device is in the first mode, and with the command/address bus having a second width over a second number of clock edges when the memory device is in the second mode. In order to properly handle commands received over different number of clock edges depending on the mode, the memory device 104 also includes logic (e.g., the CA logic 111) to determine which mode the memory device 104 is in. The CA logic 111 can include, for example, command decoding logic which determines which commands are received according to the mode of the memory device 104. After decoding the received commands, the memory device 104 executes the commands.

Figure 3:
FIG. 3 is a command truth table for a memory device with a variable-width CA bus when the memory device is in an 8-bit CA pin mode, according to one embodiment.

FIGS. 2 and 3 are command truth tables for a memory device with a variable-width CA bus, according to embodiments. Command truth tables 200 and 300 represent two examples of truth tables for a memory device with a variable-width CA bus (e.g., the memory device 104 of FIG. 1). Tables 200 and 300 includes details regarding which pins to assert (e.g., which pins to drive high, drive low, or to leave floating) to send particular commands to a memory device. The pins include command pins as well as CA pins. In tables 200 and 300, each command is sent over one clock edge, two clock edges, or three clock edges, which is depicted by the number of rows for the CA pins for each command. However, other numbers of clock edges are also possible. For example, even though a command can be sent over three clock edges, in one embodiment it is sent over four clock edges. Sending commands over an even number of clocks can enable running the internal clock at a lower rate, and thus reduce power usage.

FIG. 2 illustrates an example of a command truth table 200 when the memory device is in a 10-bit CA pin mode, and FIG. 3 illustrates an example of a command truth table 300 when the memory device is in an 8-bit CA pin mode, according to embodiments of the invention. However, because tables 200 and 300 are for a memory device with a variable-width CA bus, table 200 or table 300 may be only one of a plurality of truth tables for a given memory device and/or memory controller depending on the memory device mode. For example, a memory controller can send commands in accordance with table 200 when the memory controller determines that the target memory device is in one mode, and send commands in accordance with table 300 when the memory controller determines that the target memory device is in another mode. According to one embodiment, when the memory device operates in different modes, the command bits are substantially the same for a given command, but are packaged across a narrower interface or a wider interface for the CA bus. For example, an Activate command can involve asserting the same command bits for narrow or wide CA buses, but can involve asserting a different number of CA pins over a different number of clock edges. In one embodiment, a variable-width CA bus can enable backwards compatibility with previous technologies. For example, a given memory device can utilize a truth table for LPDDR3 when in an LPDDR3 mode. Thus, the same hardware (e.g., memory controller and/or memory device) can be used in different configurations and/or in different combinations. For example, the same memory controller can couple with the same memory device configured in different packages having different numbers of available pins for the CA bus.

As discussed above, some commands can be transmitted over the same number of clock edges in different modes, while other commands can be transmitted over a different number of clock edges in different modes. For example, in table 200 a memory controller is to transmit an Activate command with 2 clock edges, while in table 300 the memory controller is to transmit the Activate command with more than 2 clock edges (as illustrated, 3 clock edges). On the other hand, Read and Write commands in table 200 and table 300 are transmitted over the same number of clock edges (as illustrated, 2 clock edges). However, in another embodiment, the read and write command are transmitted over different number of clock edges in different modes. For example, the read and write commands are to be transmitted over 2 clock edges in one mode, and more than 2 clock edges in another mode.

Figure 4A:
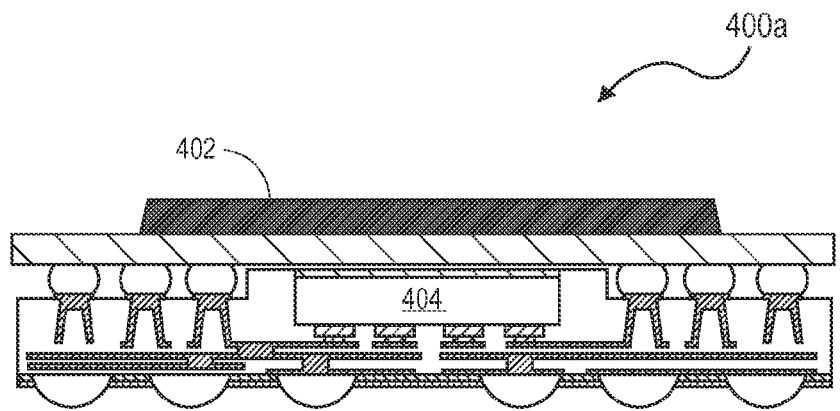
FIG. 4a is cross-sectional view of a package-on-package (PoP) configuration including a memory device with a variable-width CA bus, according to one embodiment.
Figure 4B:
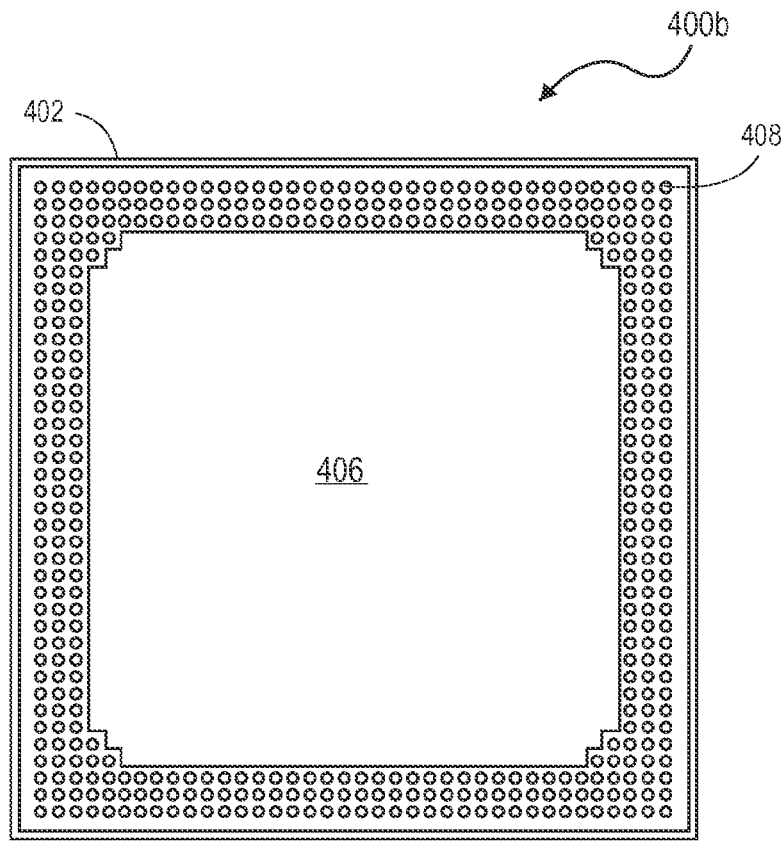
FIG. 4b is a plan view of a bottom of a PoP configuration including a memory device with a variable-width CA bus, according to one embodiment.

FIGS. 4a-4b and 5a-5b illustrate examples of different packaging configurations in which a memory device with a variable-width CA bus can be included, in accordance with embodiments of the invention. FIG. 4a is cross-sectional view 400a of a package-on-package (PoP) configuration including a memory device with a variable-width CA bus, according to one embodiment. As explained above, PoP is an integrated circuit packaging method in which two or more packages are configured on top of one another. In this example, the memory device 402 is located over the device 404 (e.g., a processor package). Thus, due to the position of the device 404, the memory device 402 has limited space for pins. The limited space for pins is evident in FIG. 4b, which is a plan view 400b of a bottom of the device 402. In this example, the device 402 includes an area 406 in which other devices can be stacked in a PoP configuration. The device 402 includes pins 408 along the perimeter of the device 402. In the illustrated example, the pins are three to four rows deep along the periphery of the package, but other configurations are also possible. For example, some PoP packages have a single row of pins along the periphery of the package.

Figure 5A:
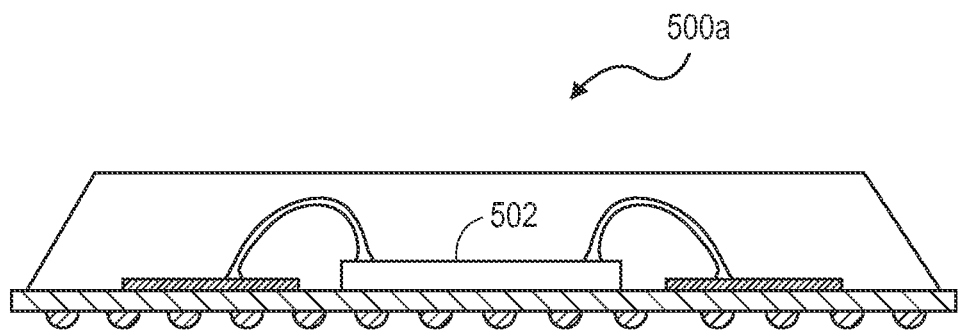
FIG. 5a is cross-sectional view of a ball-grid array (BGA) configuration including a memory device with a variable-width CA bus, according to one embodiment.
Figure 5B:
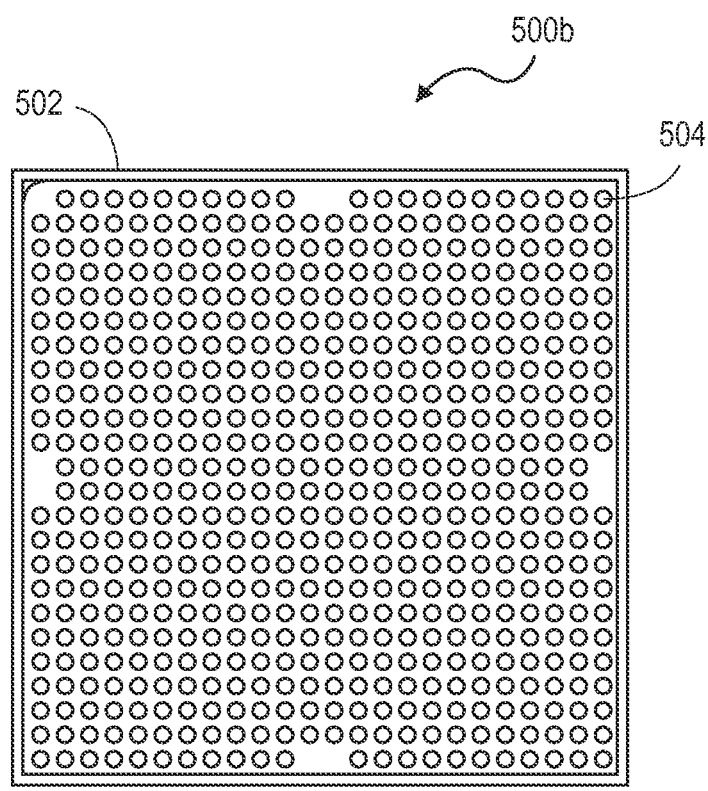
FIG. 5b is a plan view of a bottom of a BGA configuration including a memory device with a variable-width CA bus, according to one embodiment.

FIG. 5a is cross-sectional view 500a of a ball-grid array (BGA) configuration including a memory device with a variable-width CA bus, according to one embodiment. As explained above, BGA is another type of packaging for integrated circuits, in which a surface of the package has pins for interconnecting with other circuits For example, the memory device 502 is illustrated in a BGA configuration. FIG. 5b is a plan view 500b of a bottom of the device 502, which illustrates that a large area of the bottom surface of the package is available for pins 504.

Thus, a variable-width CA bus can enable using the same memory device and/or memory controller despite the different number of pins available on the package.

Figure 6:
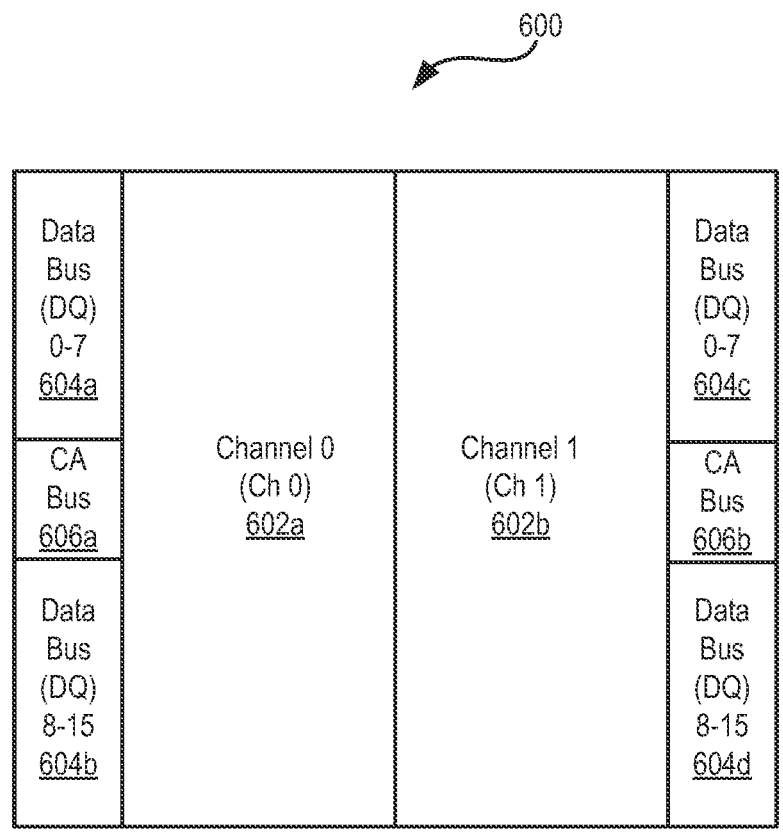
FIG. 6 is a block diagram of a memory device with two independent variable-width CA buses, according to one embodiment.

FIG. 6 is a block diagram of a memory device with two independent variable-width CA buses, according to one embodiment. Memory device 600 includes two channels, although any number of channels is possible (e.g., one channel, four channels, eight channels, etc.). The memory is configured as channel 0 602a and channel 1 602b. In one example, memory die 600 is a LPDDR4×32 die (e.g., an LPDDR4 die with a 32-bit wide data bus) which is configured as two x16 channels. Channels 0 and 1 each have corresponding data buses and command buses. For example, channel 0 receives and sends data over data buses 604a and 604b, while channel 1 sends and receives data over data buses 604c and 604d. Channel 0 receives commands over CA bus 606a, while channel 1 receives commands over CA bus 606b.

Like the variable-width CA bus 101 in FIG. 1, in the illustrated example, each of the two channels are to receive commands with independent variable-width CA buses. A memory device with independent channels can have the benefit of power savings due to, for example, the data and corresponding CA bus being located in close proximity. For example, as illustrated in FIG. 6, the data is located in four quadrants, and can be routed to the nearest quadrant rather than routed to the opposite side of the die as is done in some existing memory die layouts. Signaling can also be improved by a multi-channel layout such as in memory device 600 due to having a small gap between corresponding CA and data buses, thus reducing the need to manage skew on the buses.

Memory configurations with multiple channels can require a greater number of pins to accommodate a greater number of CA buses. Thus, the memory device 600 is one example in which a variable-width CA bus can enable the same die to fit into multiple different form factors. For example, each of the independent variable-width CA buses can have a first width and receive a particular command over a first number of clock edges in a first mode, and each of the independent command/address buses can have a second width and receive the command over a second number of clock edges in a second mode.

Figure 7:
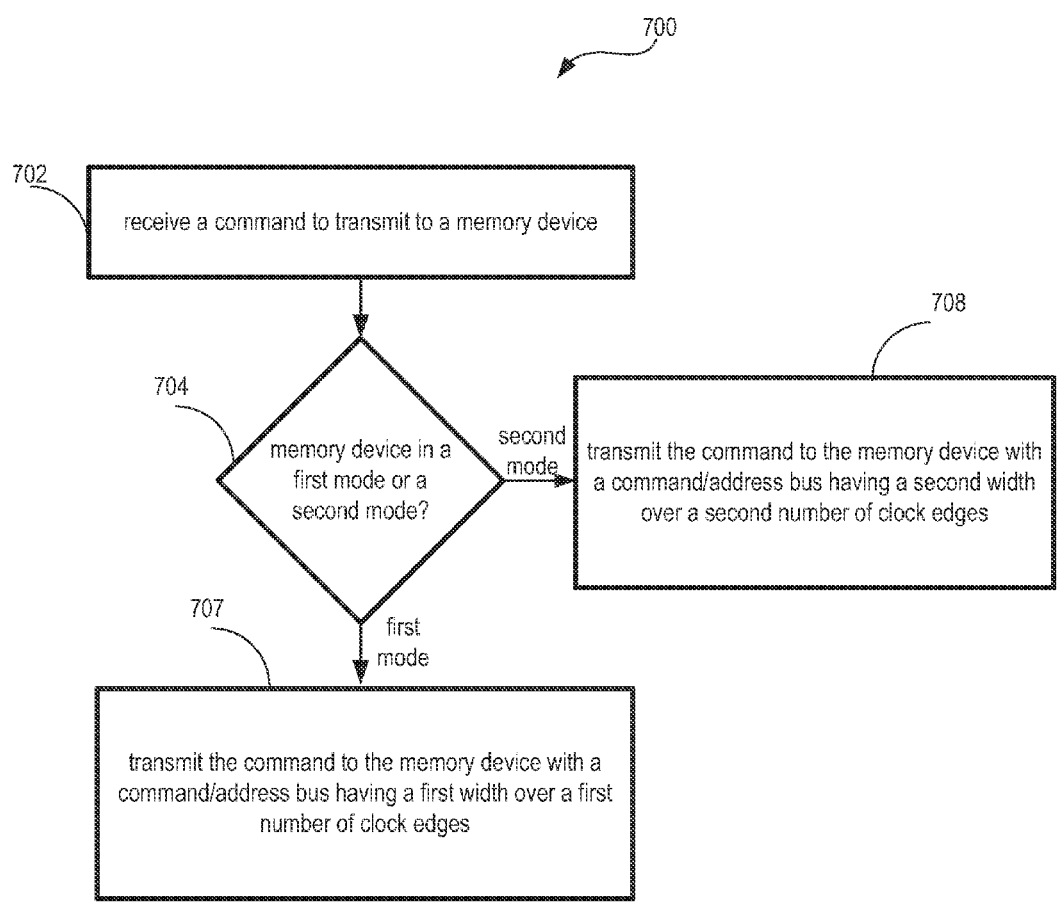
FIG. 7 is a flow diagram for sending variable-width commands to a memory device, according to one embodiment.

FIG. 7 is a flow diagram for sending variable-width commands to a memory device, according to one embodiment.

Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible.

The process 700 begins when a memory controller (e.g., the memory controller 102 of FIG. 1) receives a command to transmit to a memory device, 702. For example, the memory controller can receive a read or write command from a processor. The memory controller determines whether a memory device (e.g., the memory device 104 of FIG. 1) is in a first mode or a second mode, 704. The mode of the memory device determines how many pins the command will be sent over, and over how many clock edges the command will be sent over. In response to determining that the memory device is in a first mode, the memory controller transmits the command to the memory device with a command/address bus having a first width over a first number of clock edges, 707. In response to determining that the memory device is in the second mode, the memory controller transmits the command to the memory with the command/address bus having a second width over a second number of clock edges, 708. Thus, the same memory device can be dynamically operated in different modes with a different number of CA bus pins.

Figure 8:
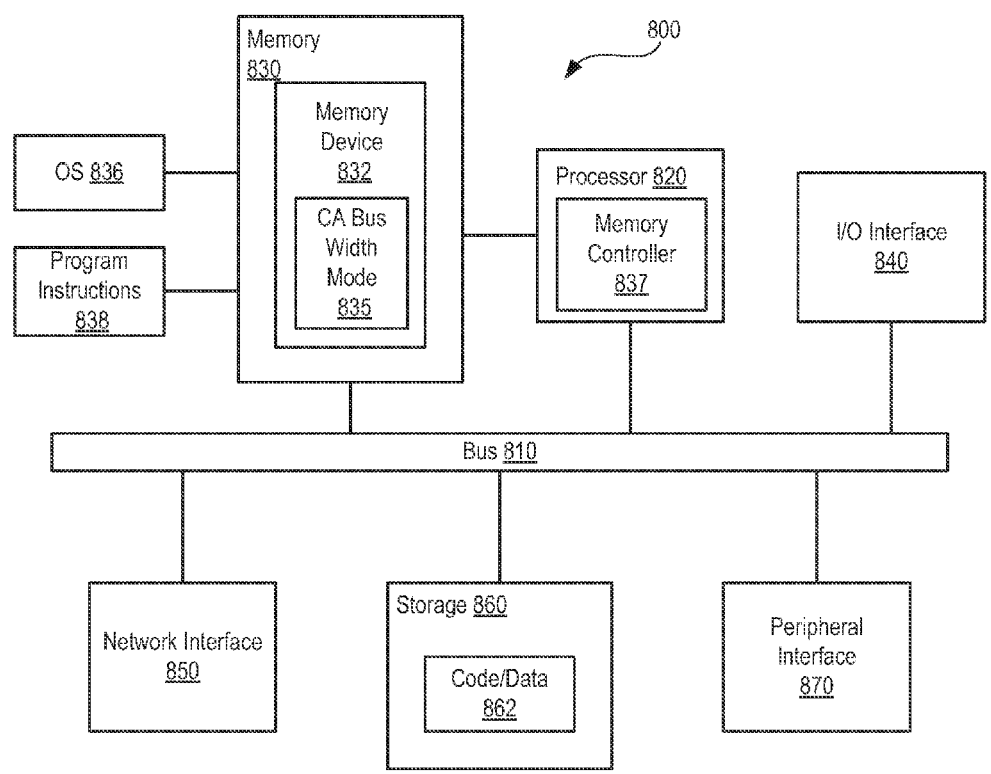
FIG. 8 is a block diagram of an embodiment of a computing system in which a variable-width CA bus can be implemented.

FIG. 8 is a block diagram of an embodiment of a computing system in which a variable-width CA bus can be implemented.

System 800 represents a computing device in accordance with any embodiment described herein, and can be a laptop computer, a desktop computer, a server, a gaming or entertainment control system, a scanner, copier, printer, or other electronic device. One or more components of system 800 can include connectors and/or circuit modules in accordance with embodiments described herein. It will be understood that certain of the components are shown generally, and not all components of a computing system are shown in system 800. System 800 includes processor 820, which provides processing, operation management, and execution of instructions for system 800. Processor 820 can include any type of microprocessor, central processing unit (CPU), processing core, or other processing hardware to provide processing for system 800. Processor 820 controls the overall operation of system 800, and can include one or more programmable general-purpose or special-purpose microprocessors, digital signal processors (DSPs), programmable controllers, application specific integrated circuits (ASICs), programmable logic devices (PLDs), or the like, or a combination of such devices.

The memory 830 can represent main memory, cache, or any other memory (e.g., any device providing storage for code to be executed by processor 820 or data values) for system 800. The memory 830 includes one or more memory devices 832 (e.g., the memory device 104 of FIG. 1) that can include read-only memory (ROM), flash memory, one or more varieties of random access memory (RAM), or other memory devices, or a combination of such devices. Processor 820 includes a memory controller 837. According to one embodiment, the memory controller 837 is located externally from the processor 820. In one embodiment, the memory 830 is located on processor 820. In another embodiment, the memory 830 is located on a separate device.

The memory controller 837 can control read and write operations to and from the memory device 832. In one embodiment, the memory controller 837 includes logic to determine whether the memory device 832 is in a first mode or a second mode, and logic to transmit a command to the memory device 832 with a command/address bus having a first width over a first number of clock edges when the memory device is in the first mode, and with the command/address bus having a second width over a second number of clock edges when the memory device is in the second mode. The memory 830 further includes a CA bus width mode 835, which can include, for example, one or more mode registers, one or more pads, or any other means of setting the mode.

Determining the mode of the memory device 832 can include determining the value of the CA bus width mode 835.

The memory 830 can store and host, among other things, operating system (OS) 836 to provide a software platform for execution of instructions in system 800. Additionally, other program instructions 838 are stored and executed from memory 830 to provide the logic and the processing of system 800. OS 836 and program instructions 838 are executed by processor 820.

The processor 820 and the memory 830 are coupled to a bus/bus system 810. The bus 810 is an abstraction that represents any one or more separate physical buses, communication lines/interfaces, and/or point-to-point connections, connected by appropriate bridges, adapters, and/or controllers. Therefore, the bus 810 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 810 can also correspond to interfaces in network interface 850.

In one embodiment, bus 810 includes a data bus that is a data bus included in the memory 830 over which processor 820 can read values from the memory device 832. The additional line shown linking processor 820 to the memory 830 represents a command bus over which processor 820 provides commands and addresses to access the memory device 832.

System 800 also includes one or more input/output (I/O) interface(s) 840, network interface 850, one or more internal mass storage device(s) 860, and peripheral interface 870 coupled to bus 810. I/O interface 840 can include one or more interface components through which a user interacts with system 800 (e.g., video, audio, and/or alphanumeric interfacing). Network interface 850 provides system 800 the ability to communicate with remote devices (e.g., servers, other computing devices) over one or more networks. Network interface 850 can include an Ethernet adapter, wireless interconnection components, USB (universal serial bus), one or more antennae, or other wired or wireless standards-based or proprietary interfaces.

Storage 860 can be or include any conventional medium for storing large amounts of data in a nonvolatile manner, such as one or more magnetic, solid state, or optical based disks, or a combination. Storage 860 holds code or instructions and data 862 in a persistent state (i.e., the value is retained despite interruption of power to system 800). Storage 860 can also be generically considered to be a "memory." Whereas storage 860 is nonvolatile, the memory device 832 can include volatile (i.e., the value or state of the data is indeterminate if power is interrupted to system 800) and/or non-volatile memory.

Peripheral interface 870 can include any hardware interface not specifically mentioned above. Peripherals refer generally to devices that connect dependently to system 800. A dependent connection is one where system 800 provides the software and/or hardware platform on which operation executes, and with which a user interacts.

Various components described herein can be a means for performing the operations or functions described. Each component described herein includes software, hardware, or a combination of these. The components can be implemented as software modules, firmware modules, hardware modules, special-purpose hardware (e.g., application specific hardware, application specific integrated circuits (ASICs), digital signal processors (DSPs), or other special-purpose hardware), embedded controllers, hardwired circuitry, or as any combination of software, firmware, and/or hardware.

Figure 9:
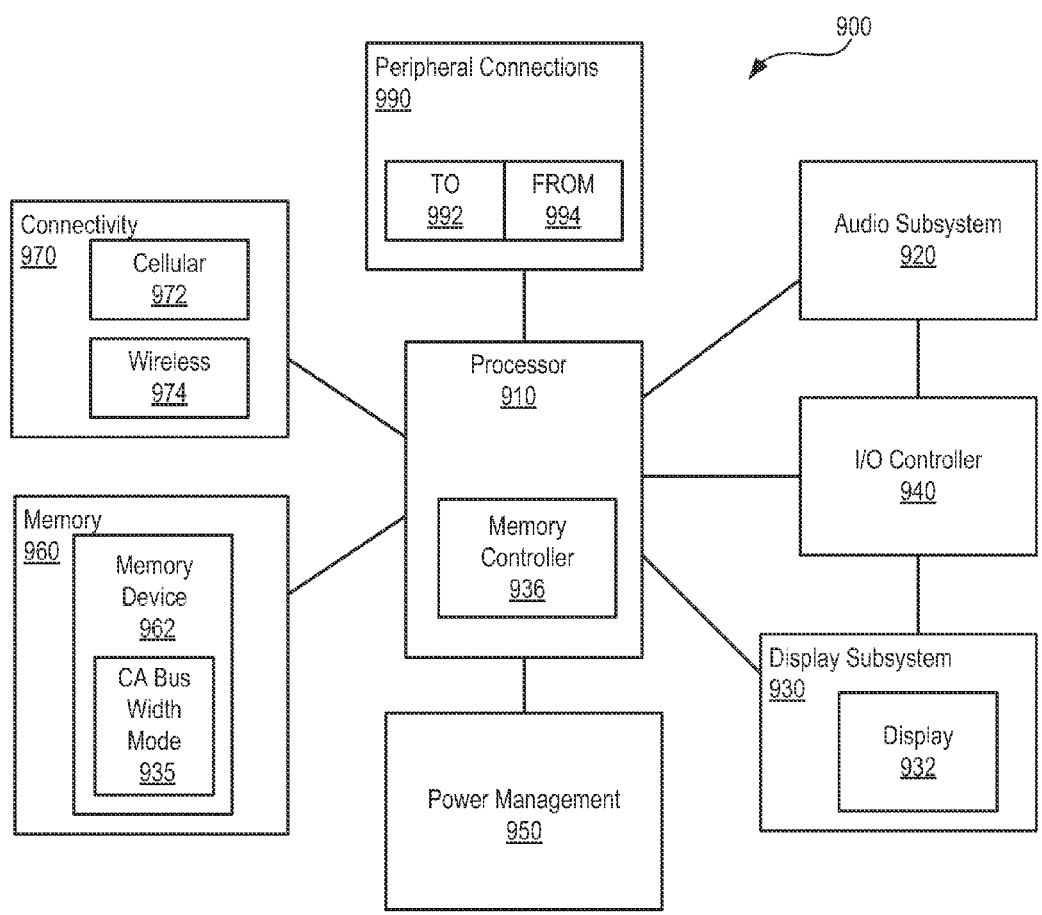
FIG. 9 is a block diagram of an embodiment of a mobile device in which a variable-width CA bus can be implemented.

FIG. 9 is a block diagram of an embodiment of a mobile device in which a variable-width CA bus can be implemented.

Device 900 represents a mobile computing device, such as a computing tablet, a mobile phone or smartphone, a wireless-enabled e-reader, or other mobile device. One or more components of system 900 can include connectors and/or circuit modules in accordance with embodiments described herein. It will be understood that certain of the components are shown generally, and not all components of such a device are shown in device 900.

Device 900 includes processor 910, which performs the primary processing operations of device 900. Processor 910 can include one or more physical devices, such as microprocessors, application processors, microcontrollers, programmable logic devices, or other processing means. In one embodiment, processor 910 includes optical interface components in addition to a processor die. Thus, the processor die and photonic components are in the same package. Such a processor package can interface optically with an optical connector in accordance with any embodiment described herein.

The processing operations performed by processor 910 include the execution of an operating platform or operating system on which applications and/or device functions are executed. The processing operations include operations related to I/O (input/output) with a human user or with other devices, operations related to power management, and/or operations related to connecting device 900 to another device. The processing operations can also include operations related to audio I/O and/or display I/O.

In one embodiment, device 900 includes audio subsystem 920, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 900, or connected to device 900. In one embodiment, a user interacts with device 900 by providing audio commands that are received and processed by processor 910.

Display subsystem 930 represents hardware (e.g., display devices) and software (e.g., drivers) components that provide a visual and/or tactile display for a user to interact with the computing device. Display subsystem 930 includes display 932, which includes the particular screen or hardware device used to provide a display to a user. In one embodiment, display 932 includes logic separate from processor 910 to perform at least some processing related to the display. In one embodiment, display subsystem 930 includes a touchscreen device that provides both output to and input from a user.

I/O controller 940 represents hardware devices and software components related to interaction with a user. I/O controller 940 can operate to manage hardware that is part of audio subsystem 920 and/or display subsystem 930. Additionally, I/O controller 940 illustrates a connection point for additional devices that connect to device 900 through which a user might interact with the system. For example, devices that can be attached to device 900 might include microphone devices, speaker or stereo systems, video systems or other display device, keyboard or keypad devices, or other I/O devices for use with specific applications such as card readers or other devices.

As mentioned above, I/O controller 940 can interact with audio subsystem 920 and/or display subsystem 930. For example, input through a microphone or other audio device can provide input or commands for one or more applications or functions of device 900. Additionally, audio output can be provided instead of or in addition to display output. In another example, if display subsystem 930 includes a touchscreen, the display device 932 also acts as an input device, which can be at least partially managed by I/O controller 940. There can also be additional buttons or switches on device 900 to provide I/O functions managed by I/O controller 940.

In one embodiment, I/O controller 940 manages devices such as accelerometers, cameras, light sensors or other environmental sensors, gyroscopes, global positioning system (GPS), or other hardware that can be included in device 900. The input can be part of direct user interaction, as well as providing environmental input to the system to influence its operations (such as filtering for noise, adjusting displays for brightness detection, applying a flash for a camera, or other features).

The memory 960 includes one or more memory devices 962 for storing information in device 900. The memory device 962 can include non-volatile (state does not change if power to the memory device is interrupted) and/or volatile (state is indeterminate if power to the memory device is interrupted) memory devices. Memory 960 can store application data, user data, music, photos, documents, or other data, as well as system data (whether long-term or temporary) related to the execution of the applications and functions of system 900. Processor 910 includes a memory controller 936. In one embodiment, the memory controller 936 is located externally from the processor 910. In one embodiment, the memory 960 is located on processor 910. In another embodiment, the memory 960 is located on a separate device.

The memory controller 936 can control read and write operations to and from the memory device 962. In one embodiment, the memory controller 936 includes logic to determine whether the memory device 962 is in a first mode or a second mode, and logic to transmit a command to the memory device 962 with a command/address bus having a first width over a first number of clock edges when the memory device is in the first mode, and with the command/address bus having a second width over a second number of clock edges when the memory device is in the second mode. The memory 960 further includes a CA bus width mode 935, which can include, for example, one or more mode registers, one or more pads, or any other means of setting the mode. Determining the mode of the memory device 962 can include determining the value of the CA bus width mode 935.

In one embodiment, device 900 includes power management 950 that manages battery power usage, charging of the battery, and features related to power saving operation. Power management 950 can initiate a transition between two or more power states for system 900, or for select sub-parts of system 900.

Connectivity 970 includes hardware devices (e.g., wireless and/or wired connectors, one or more antennae, and/or communication hardware) and software components (e.g., drivers, protocol stacks) to enable device 900 to communicate with external devices. The device could be separate devices, such as other computing devices, wireless access points or base stations, as well as peripherals such as headsets, printers, or other devices.

Connectivity 970 can include multiple different types of connectivity. To generalize, device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 974 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 990 include hardware interfaces and connectors, as well as software components (e.g., drivers, protocol stacks) to make peripheral connections. It will be understood that device 900 could both be a peripheral device ("to" 992) to other computing devices, as well as have peripheral devices ("from" 994) connected to it. Device 900 commonly has a "docking" connector to connect to other computing devices for purposes such as managing (e.g., downloading and/or uploading, changing, synchronizing) content on device 900. Additionally, a docking connector can allow device 900 to connect to certain peripherals that allow device 900 to control content output, for example, to audiovisual or other systems.

In addition to a proprietary docking connector or other proprietary connection hardware, device 900 can make peripheral connections 990 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

In one embodiment, a memory controller includes: first logic to determine whether a memory device is in a first mode or a second mode; and second logic to transmit a command to the memory device with a command/address bus having a first width over a first number of clock edges when the memory device is in the first mode, and with the command/address bus having a second width over a second number of clock edges when the memory device is in the second mode.

In one embodiment, the first width in the first mode is greater than the second width in the second mode; the first number of clock edges in the first mode is less than the second number of clock edges in the second mode.

In one embodiment, the command includes a row selection. In one embodiment, the command is an Activate command to be transmitted with two clock edges in the first mode, and more than two clock edges in the second mode. In one embodiment, a Read command and a Write command are to be transmitted over two clock edges in the first mode, and more than two clock edges in the second mode.

In one embodiment, the memory controller includes a control register indicating the first mode or the second mode based on the value of the control register.

According to one embodiment, a memory device includes logic to receive a command with a command/address bus having a first width over a first number of clock edges when the memory device is in the first mode, and with the command/address bus having a second width over a second number of clock edges when the memory device is in the second mode, and second logic to determine whether the memory device is in the first mode or the second mode.

In one embodiment, the memory device includes a pad to enable the first mode or the second mode based on the pad being tied to ground or VCC. In one embodiment the memory device includes a control register to enable the first mode or the second mode based on the value of the control register.

In one embodiment, the memory device is in a package-on-package (PoP) package configuration and is to operate in the first mode. In one embodiment, the memory device is in a ball grid array (BGA) package configuration and is to operate in the second mode.

In one embodiment, the memory device includes two or more channels, each of the two or more channels to receive the command with independent command/address buses having the first width over the first number of clock edges in the first mode, and with the independent command/address buses having the second width over the second number of clock edges in the second mode.

According to one embodiment, a system includes a processor; a memory device; a memory controller including first logic to determine whether the memory device is in a first mode or a second mode and second logic to transmit a command to the memory device with a command/address bus having a first width over a first number of clock edges when the memory device is in the first mode, and with the command/address bus having a second width over a second number of clock edges when the memory device is in the second mode; and a display.

We claim:

1. A memory controller comprising:
   first logic to determine whether a memory device is in a first mode or a second mode, wherein the first mode corresponds to a first package configuration and a first command/address bus width, and the second mode corresponds to a second package configuration and a second command/address bus width, wherein the first package configuration is different than the second package configuration, and wherein the first command/address bus width is different than the second command/address bus width; and
   second logic to transmit a command to the memory device with a command/address bus having the first width over a first number of clock edges when the memory device is in the first mode, and with the command/address bus having the second width over a second number of clock edges when the memory device is in the second mode.

2. The memory controller of claim 1, wherein:
   the first width in the first mode is greater than the second width in the second mode; and
   the first number of clock edges in the first mode is less than the second number of clock edges in the second mode.

3. The memory controller of claim 2, wherein the first package configuration comprises a package-on-package (PoP) package configuration.

4. The memory controller of claim 2, wherein the second package configuration comprises a ball grid array (BGA) package configuration.

5. The memory controller of claim 1, wherein:
   the memory device has two or more channels, each of the two or more channels to receive the command with independent command/address buses having the first width over the first number of clock edges in the first mode, and with the independent command/address buses having the second width over the second number of clock edges in the second mode.

6. The memory controller of claim 1, wherein the command comprises a row selection.

7. The memory controller of claim 6, wherein:
   the command is an Activate command to be transmitted with two clock edges in the first mode, and more than two clock edges in the second mode.

8. The memory controller of claim 1, wherein:
   a Read command and a Write command are to be transmitted over two clock edges in the first mode, and more than two clock edges in the second mode.

9. The memory controller of claim 1, further comprising:
   a control register indicating the first mode or the second mode based on the value of the control register.

10. A memory device comprising:
    logic to receive a command with a command/address bus having a first width over a first number of clock edges when the memory device is in the first mode, and with the command/address bus having a second width over a second number of clock edges when the memory device is in the second mode; and
    second logic to determine whether the memory device is in the first mode or the second mode, wherein the first mode corresponds to a first package configuration and the first width, and the second mode corresponds to a second package configuration and the second width wherein the first package configuration is different than the second package configuration, and wherein the first command/address bus width is different than the second command/address bus width.

11. The memory device of claim 10, further comprising:
    a pad to enable the first mode or the second mode based on the pad being tied to ground or VCC.

12. The memory device of claim 10, wherein:
    the first width in the first mode is greater than the second width in the second mode; and
    the first number of clock edges in the first mode is less than the second number of clock edges in the second mode.

13. The memory device of claim 12, wherein the first package configuration comprises a package-on-package (PoP) package configuration.

14. The memory device of claim 13, wherein the first package configuration comprises a ball grid array (BGA) package configuration.

15. The memory device of claim 10, further comprising:
    two or more channels, each of the two or more channels to receive the command with independent command/address buses having the first width over the first number of clock edges in the first mode, and with the independent command/address buses having the second width over the second number of clock edges in the second mode.

16. The memory device of claim 10, wherein the command comprises a row selection.

17. The memory device of claim 16, wherein:
    the command is an Activate command to be transmitted with two clock edges in the first mode, and more than two clock edges in the second mode.

18. The memory device of claim 10, wherein:
    a Read command and a Write command are to be transmitted over two clock edges in the first mode, and more than two clock edges in the second mode.

19. The memory device of claim 10, further comprising:
    a control register to enable the first mode or the second mode based on the value of the control register.

20. A system comprising:
    a processor;
    a memory device;
    a memory controller comprising:
        first logic to determine whether the memory device is in a first mode or a second mode, wherein the first mode corresponds to a first package configuration and a first command/address bus width, and the second mode corresponds to a second package configuration and a second command/address bus width, wherein the first package configuration is different than the second package configuration, and wherein the first command/address bus width is different than the second command/address bus width; and second logic to transmit a command to the memory device with a command/address bus having the first width over a first number of clock edges when the memory device is in the first mode, and with the command/address bus having the second width over a second number of clock edges when the memory device is in the second mode; and a display.

* * * * *